United States Patent
Chen et al.

(10) Patent No.: US 12,013,362 B2
(45) Date of Patent: Jun. 18, 2024

(54) LIQUID DETECTION APPARATUS AND METHOD OF DETECTING LIQUID IN WAFER PROCESSING DEVICE

(71) Applicant: TAIWAN SEMICONDUCTOR MANUFACTURING COMPANY LIMITED, Hsin-Chu (TW)

(72) Inventors: Eric Chen, Taoyuan (TW); Snap Wang, Hsinchu (TW); James Wu, Chiayi County (TW)

(73) Assignee: TAIWAN SEMICONDUCTOR MANUFACTURING COMPANY LIMITED, Hsin-Chu (TW)

(*) Notice: Subject to any disclaimer, the term of this patent is extended or adjusted under 35 U.S.C. 154(b) by 24 days.

(21) Appl. No.: 17/723,374

(22) Filed: Apr. 18, 2022

(65) Prior Publication Data
US 2023/0333037 A1    Oct. 19, 2023

(51) Int. Cl.
    *G01N 27/12*    (2006.01)
(52) U.S. Cl.
    CPC .................. *G01N 27/12* (2013.01)
(58) Field of Classification Search
    CPC ......... G01N 27/048; G01N 27/12–122; G01N 27/125–129; G01N 27/223; G01N 27/225; G01N 27/227; G01N 2201/0238
    USPC .............. 324/634, 640, 643, 664, 665, 689, 324/694–696
    See application file for complete search history.

(56) References Cited

U.S. PATENT DOCUMENTS

| | | | | |
|---|---|---|---|---|
| 7,779,781 B2* | 8/2010 | Mertens | .............. | G03F 7/70341 |
| | | | | 427/457 |
| 9,140,658 B1* | 9/2015 | Anklesaria | ............. | G01N 27/12 |
| 2003/0011482 A1* | 1/2003 | Harms | .................... | G08B 21/20 |
| | | | | 340/618 |
| 2005/0140946 A1* | 6/2005 | Tsuji | ....................... | G03F 7/709 |
| | | | | 355/53 |

(Continued)

FOREIGN PATENT DOCUMENTS

WO    WO-2020022069 A1 *  1/2020  ............. H01L 21/02

OTHER PUBLICATIONS

Ootani et al.; Translation of WO 2020/022069 A1; Jan. 30, 2020; Translation by EPO & Google (Year: 2020).*

*Primary Examiner* — Steven L Yeninas
*Assistant Examiner* — Rahul Maini
(74) *Attorney, Agent, or Firm* — Cooper Legal Group, LLC

(57) ABSTRACT

An apparatus to detect a liquid in a wafer processing device includes a first conductor proximate the wafer processing device. The apparatus includes a second conductor spaced apart from the first conductor and proximate the wafer processing device. The apparatus includes a liquid absorption material surrounding the first conductor and the second conductor. The apparatus includes a current source coupled to the first conductor. The apparatus includes a current detector coupled to at least one of the first conductor or the second conductor. The liquid absorption material establishes a conductive pathway between the first conductor and the second conductor when the liquid absorption material absorbs the liquid in the wafer processing device. A current is generated, by the current source, in at least one of the first conductor or the second conductor through the conductive pathway. The current detector detects the current.

20 Claims, 10 Drawing Sheets

(56) References Cited

U.S. PATENT DOCUMENTS

2009/0284716 A1\* 11/2009 Kanaya ............... G03F 7/70775
   355/77
2022/0408606 A1\* 12/2022 Gao ................... H05K 7/20763

\* cited by examiner

LIQUID DETECTION APPARATUS AND METHOD OF DETECTING LIQUID IN WAFER PROCESSING DEVICE

BACKGROUND

Semiconductor devices are formed on, in, and/or from semiconductor wafers, and are used in a multitude of electronic devices, such as mobile phones, laptops, desktops, tablets, watches, gaming systems, and various other industrial, commercial, and consumer electronics. One or more wafer processing devices are used in semiconductor fabrication to form semiconductor devices on, in, and/or from a semiconductor wafer.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
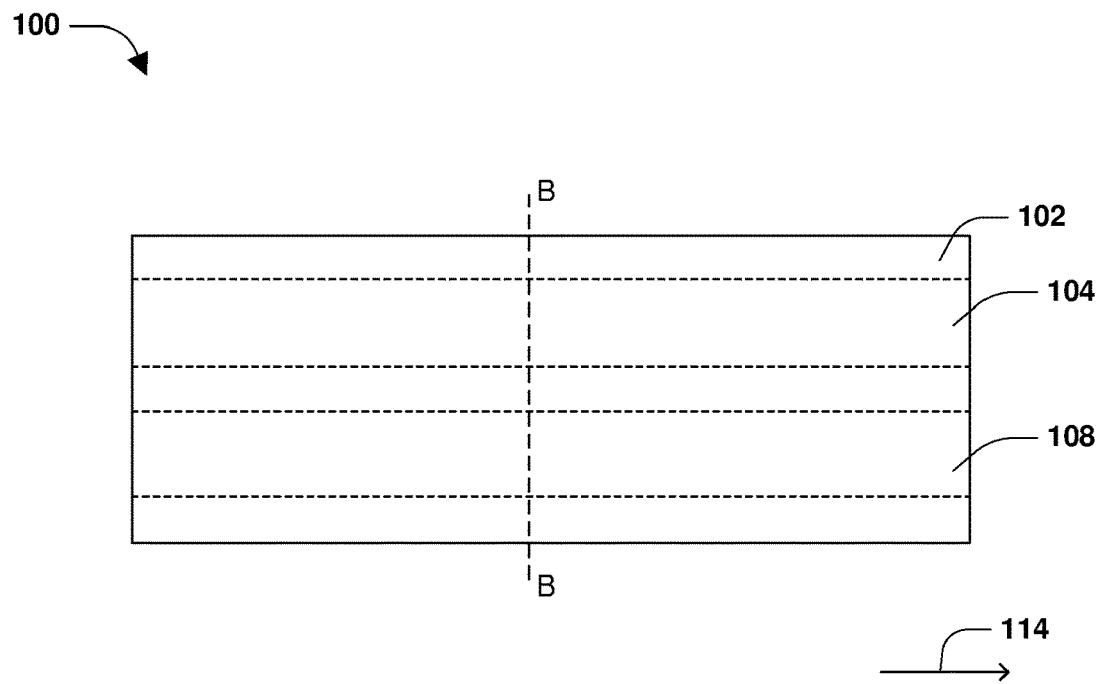
FIG. 1A illustrates a top view of at least some of a sensor line, in accordance with some embodiments.

The following disclosure provides several different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals or letters in the various examples. This repetition is for the purpose of simplicity and clarity and does not in itself dictate a relationship between the various embodiments or configurations discussed.

Further, spatially relative terms, such as "beneath," "below," "lower," "above," "upper" and the like, may be used herein for ease of description to describe one element or feature's relationship to other element(s) or feature(s) as illustrated in the figures. The spatially relative terms are intended to encompass different orientations of the device in use or operation in addition to the orientation illustrated in the figures. The apparatus may be otherwise oriented (rotated 90 degrees or at other orientations) and the spatially relative descriptors used herein may likewise be interpreted accordingly.

According to some embodiments, an apparatus has a first conductor proximate a wafer processing device, a second conductor spaced apart from the first conductor, and a liquid absorption material surrounding the first conductor and the second conductor. A power source is coupled to at least one of the first conductor or the second conductor. When the liquid absorption material absorbs a liquid, the liquid absorption material establishes a conductive pathway between the first conductor and the second conductor. A current through the conductive pathway is generated, by the power source, in at least one of the first conductor or the second conductor. The liquid in the wafer processing device is detected by detecting the current using a current detector. The apparatus has a controller configured to provide one or more signals to one or more devices. In some embodiments, the one or more signals are indicative of the liquid in the wafer processing device. In some embodiments, based upon the one or more signals, one or more maintenance operations are performed to at least one of remove liquid from the wafer processing device or repair a leaking component. Accordingly, liquid in the wafer processing device is automatically detected without relying upon a technician to manually inspect the wafer processing device to visually identify the liquid in the wafer processing device. In some embodiments, the one or more signals have an instruction to disconnect a liquid cooling system from a liquid supply, such as a water supply. Disconnecting the liquid cooling system from the liquid supply can reduce an amount of liquid that enters the wafer processing device, thereby mitigating damage to at least one of the wafer processing device or one or more wafers within the wafer processing device.

Figure 1B:
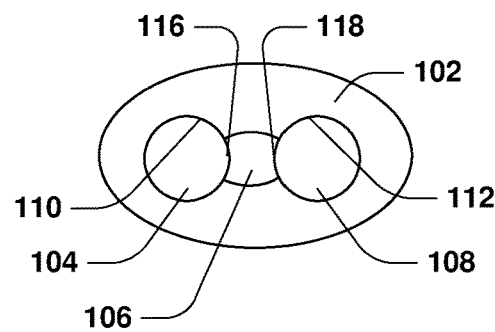
FIG. 1B illustrates a cross-sectional view of at least some of a sensor line, in accordance with some embodiments.

FIGS. 1A and 1B illustrate a sensor line 100 according to some embodiments. FIG. 1A illustrates a top view of the sensor line 100 and the view depicted in FIG. 1B is a cross-sectional view of the sensor line 100 taken along line B-B of FIG. 1A. The sensor line 100 is used to detect a liquid in a wafer processing device. The sensor line 100 comprises a first conductor 104 and a second conductor 108. Dashed-lines in FIG. 1A show outer boundaries of the first conductor 104 and the second conductor 108. The sensor line 100 comprises a liquid absorption material 102 surrounding the first conductor 104 and the second conductor 108. The liquid absorption material 102 comprises one or more materials that absorb liquid, such as at least one of cotton, polyester, a porous material with a porosity exceeding a threshold, or one or more other materials. In some embodiments, the first conductor 104 and the second conductor 108 are surrounded by a sheath made of the liquid absorption material 102.

The first conductor 104 comprises at least one of a first metal or other suitable material. The first metal comprises at least one of titanium (Ti), tantalum (Ta), aluminum (Al), copper (Cu), tungsten (W), or other suitable metal. The second conductor 108 comprises at least one of a second metal or other suitable material. The second metal comprises at least one of Ti, Ta, Al, Cu, W, or other suitable metal. In some embodiments, the first metal of the first conductor 104 is the same as the second metal of the second conductor 108. In some embodiments, the first metal of the first conductor 104 is different than the second metal of the second conductor 108.

The liquid absorption material 102 comprises a first inner surface 110 and a second inner surface 112 (shown in FIG. 1B). In some embodiments, the first inner surface 110 of the liquid absorption material 102 is in direct contact with an outer surface of the first conductor 104. In some embodiments, the first inner surface 110 defines a first area in which the first conductor 104 is disposed. A shape of the first area is elliptical such as a circular (shown in FIG. 1B), polygonal such as rectangular (not shown), or other shape. In some embodiments, the shape of the first area depends upon a cross-sectional shape of the first conductor 104. In some embodiments, the second inner surface 112 of the liquid absorption material 102 is in direct contact with an outer surface of the second conductor 108. In some embodiments, the second inner surface 112 defines a second area in which the second conductor 108 is disposed. A shape of the second area is elliptical such as a circular (shown in FIG. 1B), polygonal such as rectangular (not shown), or other shape. In some embodiments, the shape of the second area depends upon a cross-sectional shape of the second conductor 108.

The first conductor 104 and the second conductor 108 are spaced apart from each other. The first conductor 104 comprises a first surface 116 (shown in FIG. 1B) and the second conductor 108 comprises a second surface 118 (shown in FIG. 1B) facing the first surface 116 of the first conductor 104. In some embodiments, an area 106 between the first surface 116 and the second surface 118 is void of the liquid absorption material. In some embodiments, the area 106 comprises a material other than the liquid absorption material. In some embodiments, the area 106 comprises the liquid absorption material.

In some embodiments, a direction in which the first conductor 104 extends is parallel to a direction in which the second conductor 108 extends. At least one of the first conductor 104 or the second conductor 108 extend, through the liquid absorption material 102, in a first direction 114 (shown in FIG. 1A).

Figure 2A:
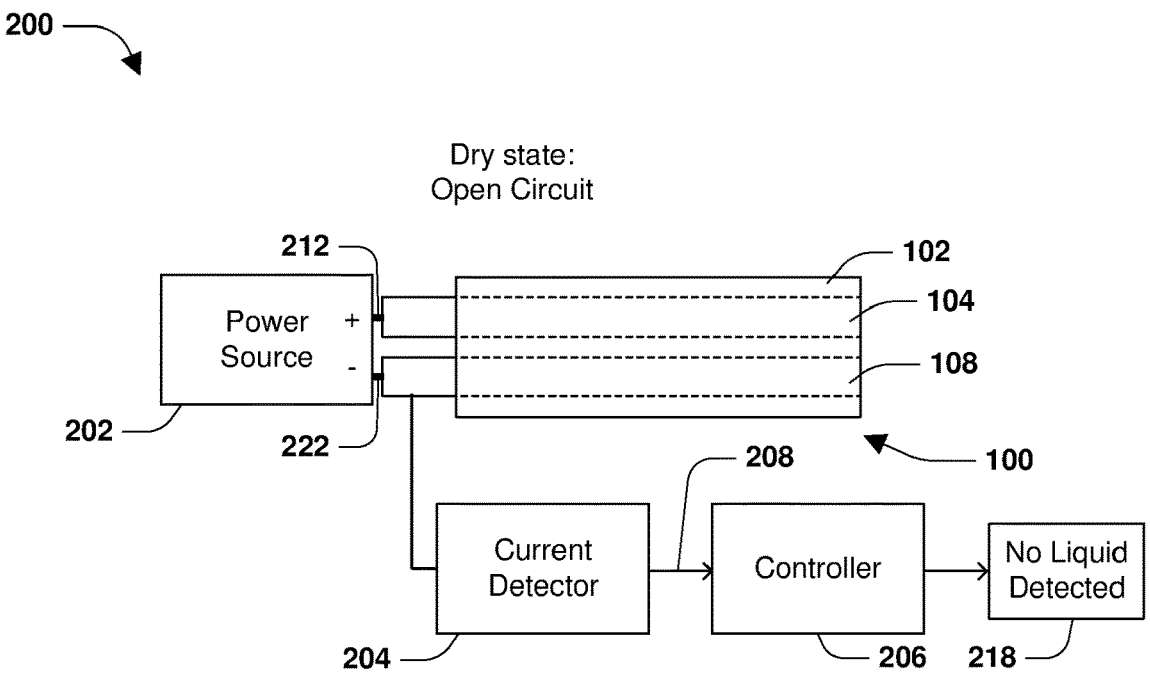
FIG. 2A illustrates a schematic view of at least some of an apparatus, in accordance with some embodiments.
Figure 2B:
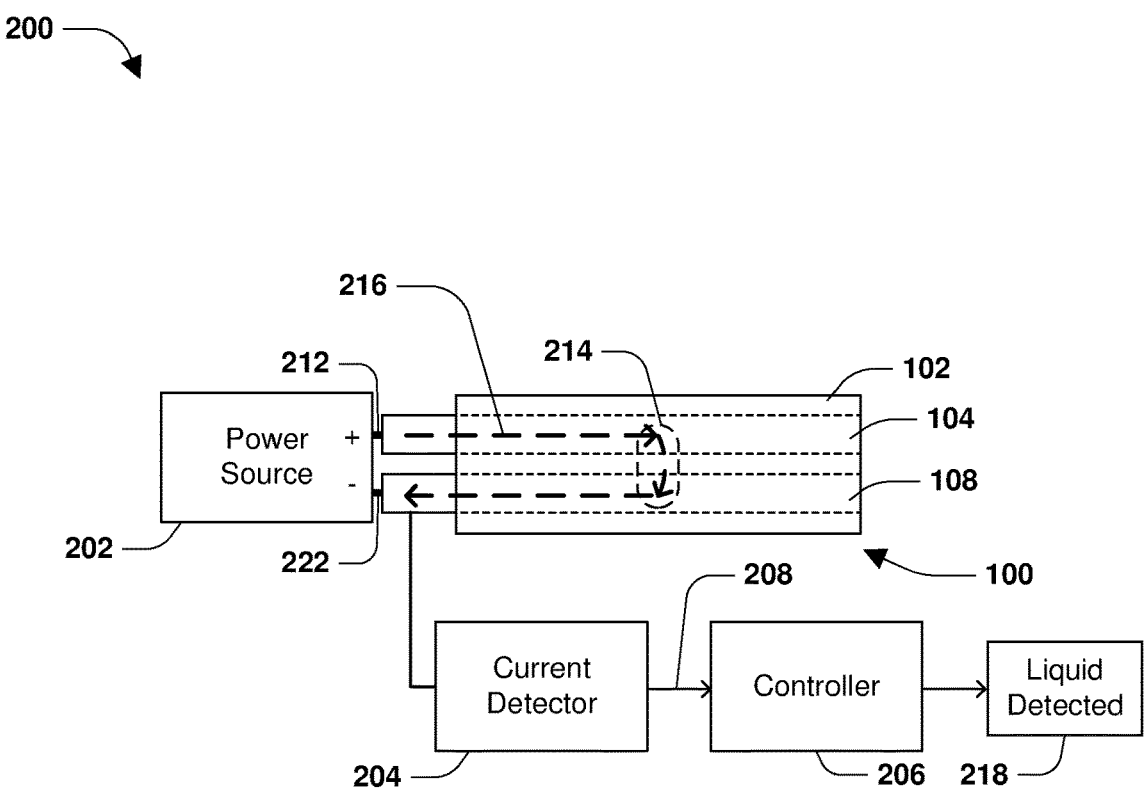
FIG. 2B illustrates a schematic view of at least some of an apparatus, in accordance with some embodiments.

FIGS. 2A-2B illustrate schematic views of an apparatus 200 comprising the sensor line 100 according to some embodiments. In some embodiments, the apparatus 200 comprises a power source 202 coupled to the sensor line 100. The power source 202 comprises at least one of a first terminal 212 coupled to the first conductor 104 or a second terminal 222 coupled to the second conductor 108. In some embodiments, current from the power source 202 does not travel through at least one of the first conductor 104 or the second conductor 108 when there is no conductive pathway between the first conductor 104 and the second conductor 108. In some embodiments, since the first conductor 104 is spaced apart from the second conductor 108, there is no conductive pathway between the first conductor 104 and the second conductor 108 when liquid is not absorbed in the liquid absorption material 102. In some embodiments, when a conductive pathway between the first conductor 104 and the second conductor 108 is established, current is generated, by the power source 202, in at least one of the first conductor 104 or the second conductor 108. In some embodiments, when liquid is absorbed in the liquid absorption material 102, a conductive pathway between the first conductor 104 and the second conductor 108 is established. The liquid absorbed in the liquid absorption material 102 forms the conductive pathway. The current generated by the power source 202 flows through the conductive pathway.

In some embodiments, the power source 202 comprises a current source. In some embodiments, the current source, such as the first terminal 212 of the current source, is coupled to the first conductor 104. In some embodiments, the current source, such as the second terminal 222 of the current source, is coupled to the second conductor 108. In some embodiments, current from the current source does not travel through at least one of the first conductor 104 or the second conductor 108 when there is no conductive pathway between the first conductor 104 and the second conductor 108. In some embodiments, when a conductive pathway between the first conductor 104 and the second conductor 108 is established, current is generated, by the current source, in at least one of the first conductor 104 or the second conductor 108. The current generated by the current source flows through the conductive pathway. In some embodiments, the current generated by the current source is a micro-current. The current generated by the current source is about 1 milliampere. Other values of the current are within the scope of the present disclosure.

In some embodiments, the power source 202 comprises a voltage source. In some embodiments, the first terminal 212 of the voltage source is a positive terminal and the second terminal 222 of the voltage source is a negative terminal. In some embodiments, the voltage source, such as the first terminal 212 of the voltage source, is coupled to the first conductor 104. In some embodiments, the voltage source, such as the second terminal 222 of the voltage source, is coupled to the second conductor 108. In some embodiments, the voltage source applies a voltage across the first conductor 104 and the second conductor 108. In some embodiments, the voltage applied by the voltage source is a micro-voltage. The voltage generated by the voltage source is about 1 millivolt. Other values of the voltage are within the scope of the present disclosure. In some embodiments, current from the voltage source does not travel through at least one of the first conductor 104 or the second conductor 108 when there is no conductive pathway between the first conductor 104 and the second conductor 108. In some embodiments, when a conductive pathway between the first conductor 104 and the second conductor 108 is established, current is generated, by the voltage source, in at least one of the first conductor 104 or the second conductor 108. The current generated by the voltage source flows through the conductive pathway.

In some embodiments, the apparatus 200 comprises a current detector 204. The current detector 204 comprises at least one of an electric meter or other device. The current detector 204 is coupled to at least one of the first conductor 104 or the second conductor 108. The current detector 204 provides a current signal 208. In some embodiments, the current signal 208 indicates whether or not current is detected in at least one of the first conductor 104 or the second conductor 108. In some embodiments, the current signal 208 is indicative of a measure, such as magnitude, of current detected in at least one of the first conductor 104 or the second conductor 108.

In some embodiments, the apparatus 200 comprises a controller 206. The controller 206 provides a controller signal 218 based upon the current signal 208. In some embodiments, the controller signal 218 indicates whether or not liquid is detected.

FIG. 2A illustrates a scenario in which liquid is not detected by the apparatus 200. In some embodiments, in the scenario of FIG. 2A, liquid is not absorbed in the liquid absorption material 102 and a conductive pathway between the first conductor 104 and the second conductor 108 is not established. In some embodiments, the controller 206 outputs the controller signal 218 to indicate that liquid is not detected (shown in FIG. 2A) at least one of based upon a measure of current indicated by the current signal 208 being less than a threshold or based upon the current signal 208 indicating that current in at least one of the first conductor 104 or the second conductor 108 is not detected.

FIG. 2B illustrates a scenario in which liquid is detected by the apparatus 200. In some embodiments, in the scenario of FIG. 2B, liquid is absorbed in the liquid absorption material 102 and a conductive pathway 214 between the first conductor 104 and the second conductor 108 is established. The conductive pathway 214 is formed from the liquid absorbed in the liquid absorption material 102. When the conductive pathway 214 is established, current 216 is generated, by the power source 202, in at least one of the first conductor 104 or the second conductor through the conductive pathway 214. As shown in FIG. 2B, in some embodiments, the current 216 flows from the power source 202, through the first conductor 104, through the conductive pathway 214, and through the second conductor 108. The current is detected by the current detector 204. The current detector 204 outputs the current signal 208 to at least one of indicate a measure of the current or indicate that the current is detected in at least one of the first conductor 104 or the second conductor 108. The controller 206 outputs the controller signal 218 to indicate that liquid is detected (shown in FIG. 2B) at least one of based upon the measure of the current indicated by the current signal 208 exceeding a threshold or based upon the current signal 208 indicating that the current in at least one of the first conductor 104 or the second conductor 108 is detected.

In some embodiments, the apparatus 200 is configured to detect a liquid in a wafer processing device. At least one of the sensor line 100, the first conductor 104, or the second conductor 108 are proximate the wafer processing device. In some embodiments, the sensor line 100 is in direct contact or in indirect contact with a component of the wafer processing device. In some embodiments, the sensor line 100, the first conductor 104 and the second conductor 108 extend across an outer surface of a component of the wafer processing device, such as where the sensor line 100, the first conductor 104 and the second conductor 108 encircle the component and/or wrap around a perimeter of the component. In some embodiments, the component comprises at least one of an exposure lens component of the wafer processing device, a cool plate of the wafer processing device, a wafer stage of the wafer processing device, a wafer of the wafer processing device, a stone of the wafer processing device, or other component of the wafer processing device. The wafer processing device comprises at least one of a photolithography exposure device or other type of wafer processing device.

Figure 3A:
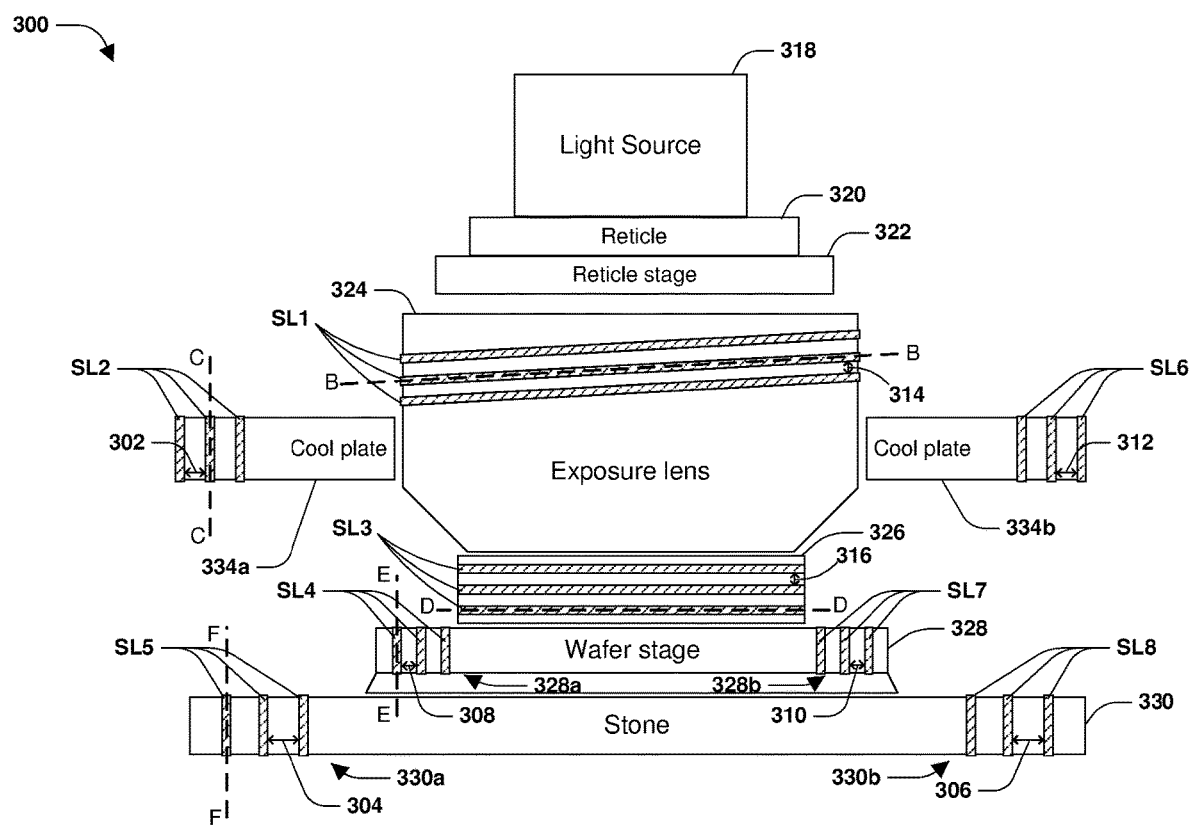
FIG. 3A illustrates a side view of at least some of a wafer processing device, in accordance with some embodiments.
Figure 3B:
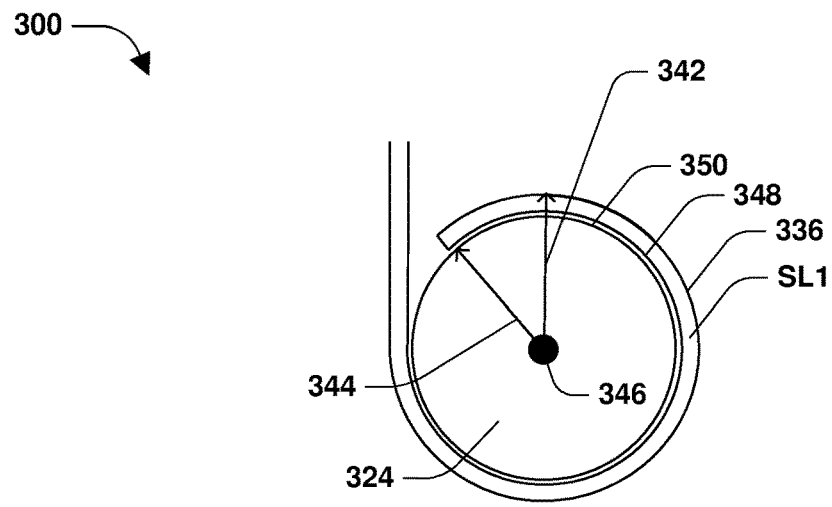
FIG. 3B illustrates a cross-sectional view of at least some of a wafer processing device, in accordance with some embodiments.
Figure 3C:
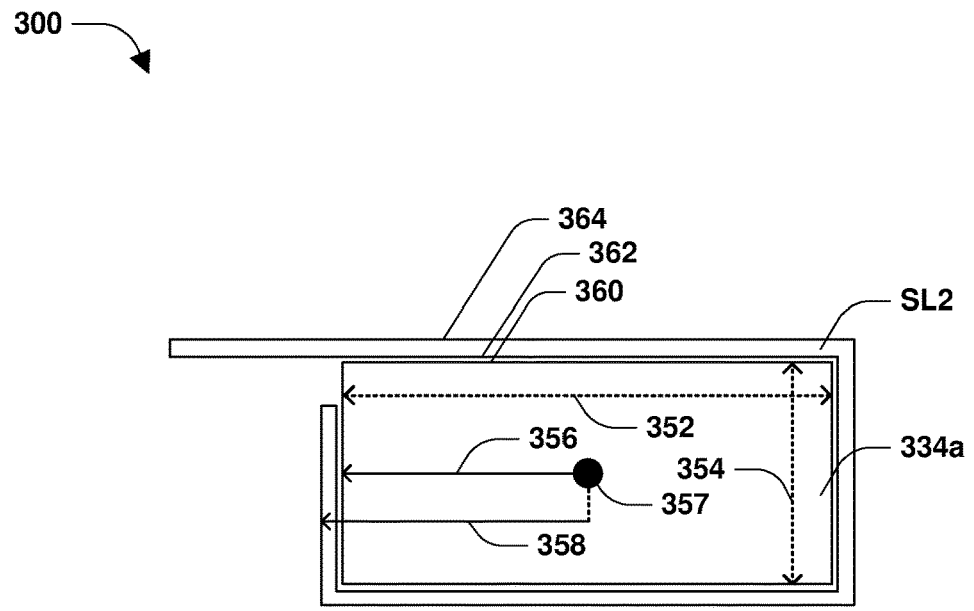
FIG. 3C illustrates a cross-sectional view of at least some of a wafer processing device, in accordance with some embodiments.
Figure 3D:
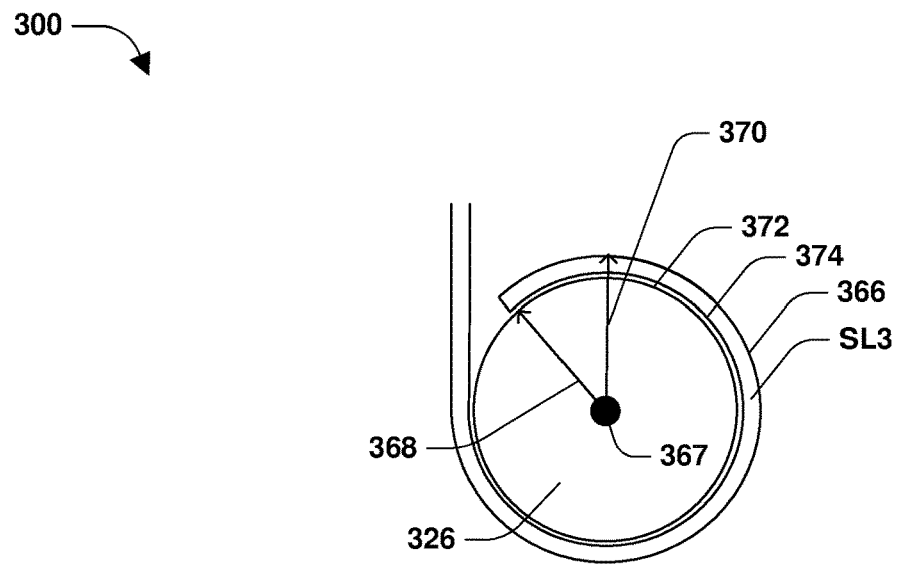
FIG. 3D illustrates a cross-sectional view of at least some of a wafer processing device, in accordance with some embodiments.
Figure 3E:
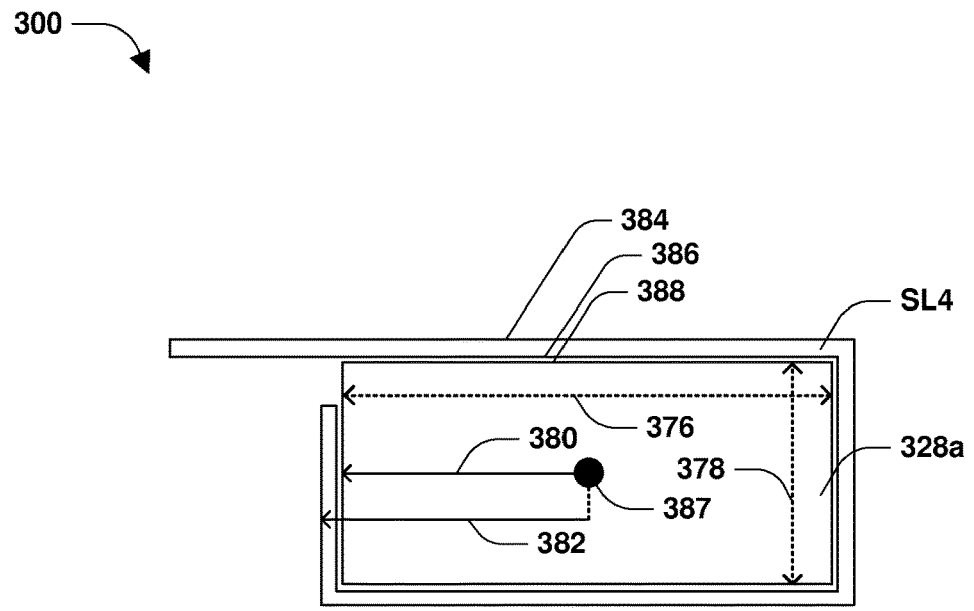
FIG. 3E illustrates a cross-sectional view of at least some of a wafer processing device, in accordance with some embodiments.
Figure 3F:
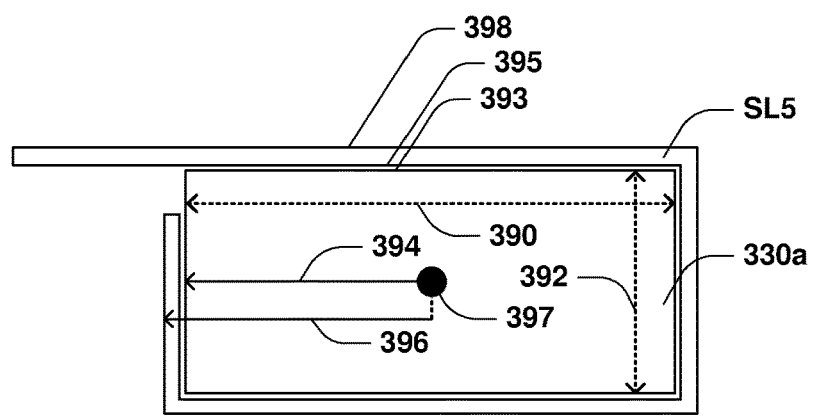
FIG. 3F illustrates a cross-sectional view of at least some of a wafer processing device, in accordance with some embodiments.

FIGS. 3A-3F illustrate a wafer processing device 300 according to some embodiments. FIG. 3A illustrates a side view of the wafer processing device 300. The view depicted in FIG. 3B is a cross-sectional view of the wafer processing device 300 taken along line B-B of FIG. 3A. The view depicted in FIG. 3C is a cross-sectional view of the wafer processing device 300 taken along line C-C of FIG. 3A. The view depicted in FIG. 3D is a cross-sectional view of the wafer processing device 300 taken along line D-D of FIG. 3A. The view depicted in FIG. 3E is a cross-sectional view of the wafer processing device 300 taken along line E-E of FIG. 3A. The view depicted in FIG. 3F is a cross-sectional view of the wafer processing device 300 taken along line F-F of FIG. 3A.

In some embodiments, the apparatus 200 is configured to detect a liquid in the wafer processing device 300. In some embodiments, the apparatus 200 comprises one or more sensor lines. In some embodiments, each sensor line of the one or more sensor lines of the apparatus 200 comprises at least some of the features and/or components provided herein with respect to the sensor line 100.

The wafer processing device 300 comprises at least one of a photolithography exposure device or other type of wafer processing device. In some embodiments, the wafer processing device 300 is configured to perform a photolithography process to form a pattern in a photoresist of a wafer 326, such as for fabrication of one or more semiconductor devices.

The wafer processing device 300 comprises at least one of a light source 318, a reticle 320, a reticle stage 322, an exposure lens component 324, a cool plate 334, a wafer stage 328, a stone 330, or other component. In some embodiments, one or more components of the wafer processing device 300 are coupled to a frame (not shown) configured to support the one or more components. In some embodiments, the one or more components comprise at least one of the light source 318, the reticle 320, the reticle stage 322, the exposure lens component 324, the cool plate 334, the wafer stage 328, the stone 330, or other component.

In some embodiments, the reticle stage 322 is configured to at least one of support the reticle 320 or maintain a position of the reticle 320 between the exposure lens component 324 and the light source 318. The wafer stage 328 is configured to at least one of support the wafer 326 or maintain a position of the wafer between the stone 330 and the exposure lens component 324.

The wafer processing device 300 is configured to expose the photoresist of the wafer 326 to light from the light source 318. In some embodiments, the light passes through the reticle 320 and the exposure lens component 324 to a top surface of the photoresist. In some embodiments, the exposure lens component 324 comprises at least one of exposure lens, an exposure lens cylinder, or an exposure lens support configured to support at least one of the exposure lens or the exposure lens cylinder. In some embodiments, illuminated portions of the top surface of the photoresist depends upon a pattern of the reticle 320, such as a mask. The photoresist comprises a light-sensitive material, where properties, such as solubility, of the photoresist are affected by light. The photoresist is a negative photoresist or a positive photoresist. With respect to a negative photoresist, regions of the negative photoresist become insoluble when illuminated by the light source 318, such that application of a solvent to the negative photoresist during a subsequent development stage removes non-illuminated regions of the negative photoresist. A pattern formed in the negative photoresist is thus a negative of a pattern defined by opaque regions of the reticle 320 between the light source 318 and the negative photoresist. In a positive photoresist, illuminated regions of the positive photoresist become soluble and are removed via application of a solvent during development. Thus, a pattern formed in the positive photoresist is a positive image of opaque regions of the reticle 320 between the light source 318 and the positive photoresist.

In some embodiments, the one or more sensor lines of the apparatus 200 comprise one or more first sensor lines SL1 proximate the exposure lens component 324. In some embodiments, the one or more first sensor lines SL1 extend across an outer surface of the exposure lens component 324, such as where the one or more first sensor lines SL1 encircle the exposure lens component 324 and/or wrap around a perimeter, such as a circumference, of the exposure lens component 324. A distance 314 between two adjacent sensor lines of the one or more first sensor lines SL1 is between about zero centimeters to about 10 centimeters. Other values of the distance 314 are within the scope of the present disclosure.

In some embodiments, the one or more sensor lines of the apparatus 200 comprise one or more second sensor lines SL2 proximate a first portion 334a of the cool plate 334. In some embodiments, the one or more second sensor lines SL2 extend across an outer surface of the first portion 334a of the cool plate 334, such as where the one or more second sensor lines SL2 wrap around a perimeter of the first portion 334a of the cool plate 334. A distance 302 between two adjacent sensor lines of the one or more second sensor lines SL2 is between about zero centimeters to about 10 centimeters. Other values of the distance 302 are within the scope of the present disclosure.

In some embodiments, the one or more sensor lines of the apparatus 200 comprise one or more third sensor lines SL3 proximate the wafer 326. In some embodiments, the one or more third sensor lines SL3 extend across an outer surface of the wafer 326, such as where the one or more third sensor lines SL3 encircle the wafer 326 and/or wrap around a perimeter, such as a circumference, of the wafer 326. A distance 316 between two adjacent sensor lines of the one or more third sensor lines SL3 is between about zero centimeters to about 10 centimeters. Other values of the distance 316 are within the scope of the present disclosure.

In some embodiments, the one or more sensor lines of the apparatus 200 comprise one or more fourth sensor lines SL4 proximate a first portion 328a of the wafer stage 328. In some embodiments, the one or more fourth sensor lines SL4 extend across an outer surface of the first portion 328a of the wafer stage 328, such as where the one or more fourth sensor lines SL4 wrap around a perimeter of the first portion 328a of the wafer stage 328. In some embodiments, at least one of the first portion 328a of the wafer stage 328 or the one or more fourth sensor lines SL4 are laterally offset from the wafer 326. In some embodiments, at least one of the first portion 328a of the wafer stage 328 or the one or more fourth sensor lines SL4 underlie the wafer 326. A distance 308 between two adjacent sensor lines of the one or more fourth sensor lines SL4 is between about zero centimeters to about 10 centimeters. Other values of the distance 308 are within the scope of the present disclosure.

In some embodiments, the one or more sensor lines of the apparatus 200 comprise one or more fifth sensor lines SL5 proximate a first portion 330a of the stone 330. In some embodiments, the one or more fifth sensor lines SL5 extend across an outer surface of the first portion 330a of the stone 330, such as where the one or more fifth sensor lines SL5 wrap around a perimeter of the first portion 330a of the stone 330. In some embodiments, at least one of the first portion 330a of the stone 330 or the one or more fifth sensor lines SL5 are laterally offset from the wafer stage 328. In some embodiments, at least one of the first portion 330a of the stone 330 or the one or more fifth sensor lines SL5 underlie the wafer stage 328. A distance 304 between two adjacent sensor lines of the one or more fifth sensor lines SL5 is between about zero centimeters to about 10 centimeters. Other values of the distance 304 are within the scope of the present disclosure.

In some embodiments, the one or more sensor lines of the apparatus 200 comprise one or more sixth sensor lines SL6 proximate a second portion 334b of the cool plate 334. In some embodiments, the one or more sixth sensor lines SL6 extend across an outer surface of the second portion 334b of the cool plate 334, such as where the one or more sixth sensor lines SL6 wrap around a perimeter of the second portion 334b of the cool plate 334. In some embodiments, the exposure lens component 324 is between the first portion 334a of the cool plate 334 and the second portion 334b of the cool plate 334. A distance 312 between two adjacent sensor lines of the one or more sixth sensor lines SL6 is between about zero centimeters to about 10 centimeters. Other values of the distance 312 are within the scope of the present disclosure.

In some embodiments, the one or more sensor lines of the apparatus 200 comprise one or more seventh sensor lines SL7 proximate a second portion 328b of the wafer stage 328. In some embodiments, the one or more seventh sensor lines SL7 extend across an outer surface of the second portion 328b of the wafer stage 328, such as where the one or more seventh sensor lines SL7 wrap around a perimeter of the second portion 328b of the wafer stage 328. In some embodiments, at least one of the second portion 328b of the wafer stage 328 or the one or more seventh sensor lines SL7 are laterally offset from the wafer 326. In some embodiments, at least one of the second portion 328b of the wafer stage 328 or the one or more seventh sensor lines SL7 underlie the wafer 326. In some embodiments, the wafer 326 overlies a portion, of the wafer stage 328, between the first portion 328a of the wafer stage 328 and the second portion 328b of the wafer stage 328. A distance 310 between two adjacent sensor lines of the one or more seventh sensor lines SL7 is between about zero centimeters to about 10 centimeters. Other values of the distance 310 are within the scope of the present disclosure.

In some embodiments, the one or more sensor lines of the apparatus 200 comprise one or more eighth sensor lines SL8 proximate a second portion 330b of the stone 330. In some embodiments, the one or more eighth sensor lines SL8 extend across an outer surface of the second portion 330b of the stone 330, such as where the one or more eighth sensor lines SL8 wrap around a perimeter of the second portion 330b of the stone 330. In some embodiments, at least one of the second portion 330b of the stone 330 or the one or more eighth sensor lines SL8 are laterally offset from the wafer stage 328. In some embodiments, at least one of the second portion 330b of the stone 330 or the one or more eighth sensor lines SL8 underlie the wafer stage 328. In some embodiments, the wafer stage 328 overlies a portion, of the stone 330, between the first portion 330a of the stone 330 and the second portion 330b of the stone 330. A distance 306 between two adjacent sensor lines of the one or more eighth sensor lines SL8 is between about zero centimeters to about 10 centimeters. Other values of the distance 306 are within the scope of the present disclosure.

Shown in FIG. 3B, a sensor line SL1 of the one or more first sensor lines SL1 extends across an outer surface 350 of the exposure lens component 324, such as across some of a circumference of the outer surface 350 of the exposure lens component 324 or across all of the circumference of the outer surface 350 of the exposure lens component 324. The sensor line SL1 comprises an inner surface 348 and an outer surface 336 opposite the inner surface 348. The inner surface 348 of the sensor line SL1 faces the outer surface 350 of the exposure lens component 324. In some embodiments, the inner surface 348 of the sensor line SL1 is at least one of aligned with the outer surface 350 of the exposure lens component 324, in direct contact with the outer surface 350 of the exposure lens component 324, or in indirect contact with the outer surface 350 of the exposure lens component 324. In some embodiments, a distance 344 between a center point 346 of a cross-section of the exposure lens component 324 shown in FIG. 3B and the outer surface 350 of the exposure lens component 324 is smaller than a distance 342 between the center point 346 and the outer surface 336 of the sensor line SL1. In some embodiments, the distance 344 corresponds to a radius of the cross-section of the exposure lens component 324.

Shown in FIG. 3C, a sensor line SL2 of the one or more second sensor lines SL2 extends across an outer surface 360 of the first portion 334a of the cool plate 334, such as across some of a perimeter of the outer surface 360 of the first portion 334a of the cool plate 334 or across all of the perimeter of the outer surface 360 of the first portion 334a of the cool plate 334. The sensor line SL2 comprises an inner surface 362 and an outer surface 364 opposite the inner surface 362. The inner surface 362 of the sensor line SL2 faces the outer surface 360 of the first portion 334a of the cool plate 334. In some embodiments, the inner surface 362 of the sensor line SL2 is at least one of aligned with the outer surface 360 of the first portion 334a of the cool plate 334, in direct contact with the outer surface 360 of the first portion 334a of the cool plate 334, or in indirect contact with the outer surface 360 of the first portion 334a of the cool plate 334. In some embodiments, a distance 356 between a center point 357 of a cross-section of the first portion 334a of the cool plate 334 shown in FIG. 3C and the outer surface 360 of the first portion 334a of the cool plate 334 is smaller than a distance 358 between the center point 357 and the outer surface 364 of the sensor line SL2. A length 352 of the first portion 334a of the cool plate 334 is smaller than, larger than or equal to a height 354 of the first portion 334a of the cool plate 334.

Shown in FIG. 3D, a sensor line SL3 of the one or more third sensor lines SL3 extends across an outer surface 372 of the wafer 326, such as across some of a circumference of the outer surface 372 of the wafer 326 or across all of the circumference of the outer surface 372 of the wafer 326. The sensor line SL3 comprises an inner surface 374 and an outer surface 366 opposite the inner surface 374. The inner surface 374 of the sensor line SL3 faces the outer surface 372 of the wafer 326. In some embodiments, the inner surface 374 of the sensor line SL3 is at least one of aligned with the outer surface 372 of the wafer 326, in direct contact with the outer surface 372 of the wafer 326, or in indirect contact with the outer surface 372 of the wafer 326. In some embodiments, a distance 368 between a center point 367 of a cross-section of the wafer 326 shown in FIG. 3D and the outer surface 372 of the wafer 326 is smaller than a distance 370 between the center point 367 and the outer surface 366 of the sensor line SL3. In some embodiments, the distance 368 corresponds to a radius of the cross-section of the wafer 326.

Shown in FIG. 3E, a sensor line SL4 of the one or more fourth sensor lines SL4 extends across an outer surface 388 of the first portion 328a of the wafer stage 328, such as across some of a perimeter of the outer surface 388 of the first portion 328a of the wafer stage 328 or across all of the perimeter of the outer surface 388 of the first portion 328a of the wafer stage 328. The sensor line SL4 comprises an inner surface 386 and an outer surface 384 opposite the inner surface 386. The inner surface 386 of the sensor line SL4 faces the outer surface 388 of the first portion 328a of the wafer stage 328. In some embodiments, the inner surface 386 of the sensor line SL4 is at least one of aligned with the outer surface 388 of the first portion 328a of the wafer stage 328, in direct contact with the outer surface 388 of the first portion 328a of the wafer stage 328, or in indirect contact with the outer surface 388 of the first portion 328a of the wafer stage 328. In some embodiments, a distance 380 between a center point 387 of a cross-section of the first portion 328a of the wafer stage 328 shown in FIG. 3E and the outer surface 388 of the first portion 328a of the wafer stage 328 is smaller than a distance 382 between the center point 387 and the outer surface 384 of the sensor line SL4. A length 376 of the first portion 328a of the wafer stage 328 is smaller than, larger than or equal to a height 378 of the first portion 328a of the wafer stage 328.

Shown in FIG. 3F, a sensor line SL5 of the one or more fifth sensor lines SL5 extends across an outer surface 393 of the first portion 330a of the stone 330, such as across some of a perimeter of the outer surface 393 of the first portion 330a of the stone 330 or across all of the perimeter of the outer surface 393 of the first portion 330a of the stone 330. The sensor line SL5 comprises an inner surface 395 and an outer surface 398 opposite the inner surface 395. The inner surface 395 of the sensor line SL5 faces the outer surface 393 of the first portion 330a of the stone 330. In some embodiments, the inner surface 395 of the sensor line SL5 is at least one of aligned with the outer surface 393 of the first portion 330a of the stone 330, in direct contact with the outer surface 393 of the first portion 330a of the stone 330, or in indirect contact with the outer surface 393 of the first portion 330a of the stone 330. In some embodiments, a distance 394 between a center point 397 of a cross-section of the first portion 330a of the stone 330 shown in FIG. 3E and the outer surface 393 of the first portion 330a of the stone 330 is smaller than a distance 396 between the center point 397 and the outer surface 398 of the sensor line SL5. A length 390 of the first portion 330a of the stone 330 is smaller than, larger than or equal to a height 392 of the first portion 330a of the stone 330.

Figure 4:
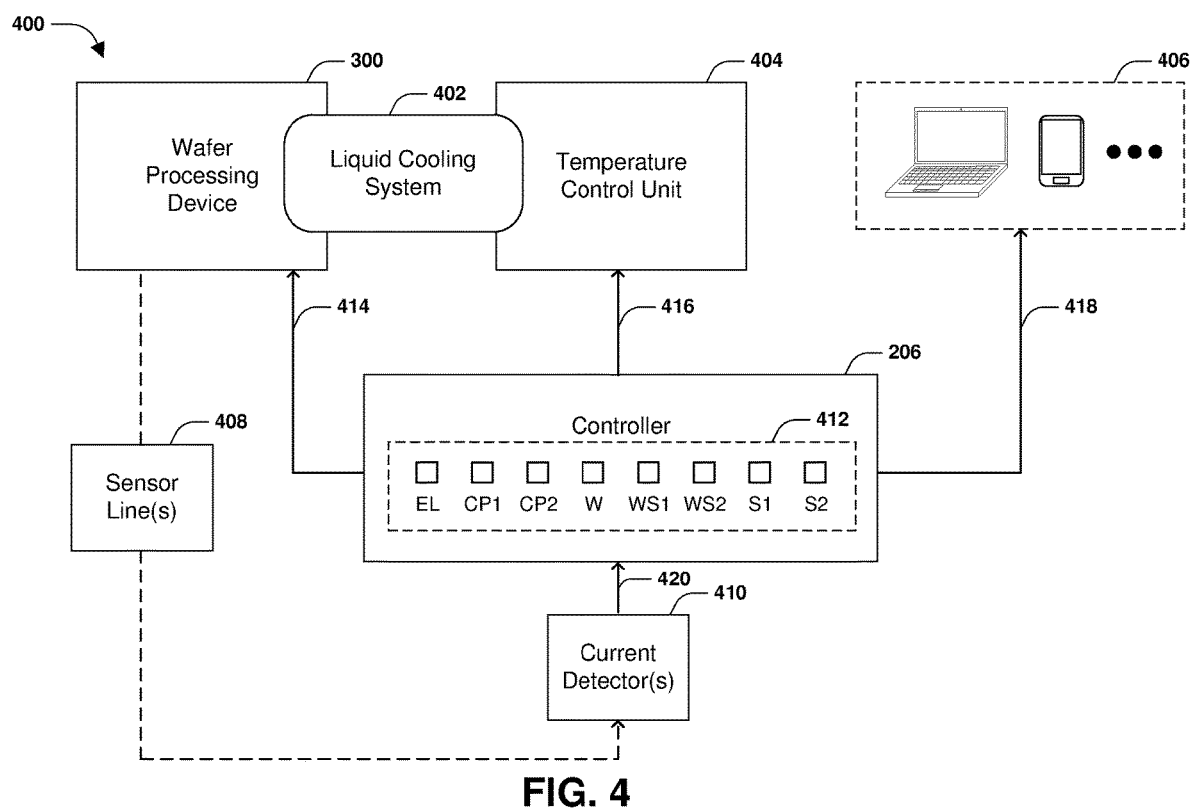
FIG. 4 illustrates a schematic view of at least some of a system, in accordance with some embodiments.

FIG. 4 illustrates a schematic view of a system 400 according to some embodiments. The system 400 comprises at least one of the apparatus 200, the wafer processing device 300, or a temperature control unit 404. In some embodiments, the temperature control unit 404 is configured to control one or more temperatures of one or more components of the wafer processing device 300 using a liquid cooling system 402. The liquid cooling system 402 comprises one or more tubes through which a liquid is conducted. The liquid used in the liquid cooling system 402 comprises at least one of water or other material. In some embodiments, the one or more tubes of the liquid cooling system 402 are proximal one or more components of the wafer processing device 300, wherein flow of the liquid through the one or more tubes results in heat removal, such as via convective heat transfer, from the one or more components.

In some embodiments, one or more current detectors 410 of the apparatus 200 are coupled to one or more sensor lines 408, such as the sensor line 100, of the apparatus 200. The one or more sensor lines 408 may comprise at least one of the one or more first sensor lines SL1, the one or more second sensor lines SL2, the one or more third sensor lines SL3, the one or more fourth sensor lines SL4, the one or more fifth sensor lines SL5, the one or more sixth sensor lines SL6, the one or more seventh sensor lines SL7, the one or more eighth sensor lines SL8, or other sensor line. The one or more current detectors 410 output one or more current signals 420, such as the current signal 208, to the controller 206.

In some embodiments, the controller 206 comprises a set of status indicators 412 associated with sections of the wafer processing device 300. In some embodiments, an indicator of the set of status indicators 412 comprises a light, such as indicator light, that indicates whether or not a liquid is detected in a section of the wafer processing device 300, wherein the light being in a first state indicates that liquid in the section of the wafer processing device 300 is detected and/or the light being in a second state indicates that liquid is not detected in the section of the wafer processing device 300. In some embodiments, the first state corresponds to a first color emitted by the light, such as red or other color, and the second state corresponds to a second color emitted by the light, such as green or other color. The set of status indicators comprises at least one of a first indicator "EL" associated with the exposure lens component 324, a second indicator "CP1" associated with the first portion 334a of the cool plate 334, a third indicator "CP2" associated with the second portion 334b of the cool plate 334, a fourth indicator "W" associated with the wafer 326, a fifth indicator "WS1" associated with the first portion 328a of the wafer stage 328, a sixth indicator "WS2" associated with the second portion 328b of the wafer stage 328, a seventh indicator "S1" associated with the first portion 330a of the stone 330, an eighth indicator "S2" associated with the second portion 330b of the stone 330, or other indicator.

In some embodiments, the first indicator "EL" indicates whether or not a liquid is detected in a first section, of the wafer processing device 300, comprising the exposure lens component 324, such as whether or not liquid is detected on or around the exposure lens component 324. In some embodiments, the controller 206 determines whether or not there is a liquid in the first section of the wafer processing device 300 based upon a first current signal, of the one or more current signals 420, from a first current detector of the one or more current detectors 410. In some embodiments, the first current detector is coupled to the one or more first sensor lines SL1.

In some embodiments, the first current signal indicates whether or not current is detected in a conductor of the one or more first sensor lines SL1. In some embodiments, the controller 206 determines that there is a liquid in the first section of the wafer processing device 300 based upon the first current signal indicating that current is detected in a conductor of the one or more first sensor lines SL1. In some embodiments, the controller 206 determines that there is not a liquid in the first section of the wafer processing device 300 based upon the first current signal indicating that current is not detected in a conductor of the one or more first sensor lines SL1.

In some embodiments, the first current signal is indicative of a measure of current detected in a conductor of the one or more first sensor lines SL1. In some embodiments, the controller 206 determines that there is a liquid in the first section of the wafer processing device 300 based upon the first current signal indicating a measure of current that exceeds a threshold. In some embodiments, the controller 206 determines that there is not a liquid in the first section of the wafer processing device 300 based upon the first current signal indicating a measure of current that is less than a threshold.

In some embodiments, the controller 206 determines liquid status information associated with the wafer processing device 300. The liquid status information indicates at least one of whether or not liquid is detected in the wafer processing device 300, one or more properties of detected liquid, or other information. In some embodiments, the one or more properties comprise a conductivity property indicative of a conductivity of a liquid detected in the wafer processing device 300. In some embodiments, the conductivity property is determined based upon a measure of current indicated by a current signal, of the one or more current signals 420, from a current detector of the one or more current detectors 410. In some embodiments, a higher value of the measure of current may corresponds to a higher value of the conductivity property. In some embodiments, the one or more properties comprise a composition property. In some embodiments, the composition property is indicative of at least one of an amount of sodium or an amount of other material present in the liquid detected in the wafer processing device 300. In some embodiments, the composition property is based upon at least one of the measure of current, the conductivity property, or other information. In some embodiments, a higher value of the measure of current and/or a higher value of the conductivity property corresponds to a higher value of the amount of sodium. In some embodiments, the one or more properties comprise a liquid amount property. In some embodiments, the liquid amount property is indicative of an amount of the liquid detected in the wafer processing device 300. In some embodiments, the liquid amount property is based upon at least one of the measure of current or other information. In some embodiments, a higher value of the measure of current corresponds to a higher value of the liquid amount property.

In some embodiments, the controller 206 determines a plurality of sets liquid status information associated with a plurality of sections of the wafer processing device 300. In some embodiments, each set of liquid status information of the plurality of sets liquid status information is indicative of at least one of whether or not liquid is detected in a section of the wafer processing device 300, a conductivity property of liquid detected in the section of the wafer processing device 300, a composition property of the liquid detected in the section of the wafer processing device 300, a liquid amount property of the liquid detected in the section of the wafer processing device 300, or other information. The plurality of sets of liquid status information comprises at least one of a first set of liquid status information associated with the first section of the wafer processing device 300 comprising the exposure lens component 324, a second set of liquid status information associated with a second section of the wafer processing device 300 comprising the first portion 334a of the cool plate 334, a third set of liquid status information associated with a third section of the wafer processing device 300 comprising the second portion 334b of the cool plate 334, a fourth set of liquid status information associated with a fourth section of the wafer processing device 300 comprising the wafer 326, a fifth set of liquid status information associated with a fifth section of the wafer processing device 300 comprising the first portion 328a of the wafer stage 328, a sixth set of liquid status information associated with a sixth section of the wafer processing device 300 comprising the second portion 328b of the wafer stage 328, a seventh set of liquid status information associated with a seventh section of the wafer processing device 300 comprising the first portion 330a of the stone 330, an eighth set of liquid status information associated with an eighth section of the wafer processing device 300 comprising the second portion 330b of the stone 330, or other set of liquid status information associated with other section of the wafer processing device 300. In some embodiments, the first set of liquid status information is indicative of at least one of whether or not liquid is detected in the first section of the wafer processing device 300, a conductivity property of liquid detected in the first section of the wafer processing device 300, a composition property of the liquid detected in the first section of the wafer processing device 300, a liquid amount property of the liquid detected in the first section of the wafer processing device 300, or other information. In some embodiments, at least one of the first set of liquid status information is determined based upon the first current signal from the first current detector coupled to the one or more first sensor lines SL1, the second set of liquid status information is determined based upon a second current signal from a second current detector coupled to the one or more second sensor lines SL2, the third set of liquid status information is determined based upon a third current signal from a third current detector coupled to the one or more sixth sensor lines SL6, the fourth set of liquid status information is determined based upon a fourth current signal from a fourth current detector coupled to the one or more third sensor lines SL3, the fifth set of liquid status information is determined based upon a fifth current signal from a fifth current detector coupled to the one or more fourth sensor lines SL4, the sixth set of liquid status information is determined based upon a sixth current signal from a sixth current detector coupled to the one or more seventh sensor lines SL7, the seventh set of liquid status information is determined based upon a seventh current signal from a seventh current detector coupled to the one or more fifth sensor lines SL5, or the eighth set of liquid status information is determined based upon an eighth current signal from an eighth current detector coupled to the one or more eighth sensor lines SL8.

In some embodiments, the controller 206 provides a signal, such as the controller signal 218, based upon the one or more current signals 420. The signal is generated using a signal generator of the controller 206. The signal is indicative of at least one of the liquid status information, the plurality of sets of liquid status information associated with the plurality of sections of the wafer processing device 300, or other information. In some embodiments, the controller 206 transmits the signal to one or more devices.

In some embodiments, the controller 206 transmits a first signal 414 to the wafer processing device 300. The first signal 414 is generated using the signal generator of the controller 206. The first signal 414 is indicative of at least one of the liquid status information, the plurality of sets of liquid status information associated with the plurality of sections of the wafer processing device 300, or other information. In some embodiments, the controller 206 transmits the first signal 414 to the wafer processing device 300 wirelessly, such as using a wireless communication device of the controller 206. In some embodiments, the controller 206 transmits the first signal 414 to the wafer processing device 300 over a physical connection between the controller 206 and the wafer processing device 300.

In some embodiments, the controller 206 transmits a second signal 416 to the temperature control unit 404. The second signal 416 is generated using the signal generator of the controller 206. The second signal 416 is indicative of at least one of the liquid status information, the plurality of sets of liquid status information associated with the plurality of sections of the wafer processing device 300, or other information. In some embodiments, the controller 206 transmits the second signal 416 to the temperature control unit 404 wirelessly, such as using the wireless communication device of the controller 206. In some embodiments, the controller 206 transmits the second signal 416 to the temperature control unit 404 over a physical connection between the controller 206 and the temperature control unit 404.

In some embodiments, the controller 206 transmits a third signal 418 to one or more client devices 406. The one or more client devices 406 comprise at least one of a phone, a smartphone, a mobile phone, a landline, a laptop, a desktop computer, hardware, or other type of client device. The third signal 418 is generated using the signal generator of the controller 206. The third signal 418 is indicative of at least one of the liquid status information, the plurality of sets of liquid status information associated with the plurality of sections of the wafer processing device 300, or other information. In some embodiments, the controller 206 transmits the third signal 418 to a client device of the one or more client devices 406 wirelessly, such as using the wireless communication device of the controller 206. In some embodiments, the controller 206 transmits the third signal 418 to a client device of the one or more client devices 406 over a physical connection between the controller 206 and the client device. In some embodiments, a client device of the one or more client devices 406 triggers an alarm based upon the third signal 418. In some embodiments, the client device triggers the alarm based upon the third signal 418 indicating that a liquid is detected in the wafer processing device 300. In some embodiments, in response to triggering the alarm, an alarm message is displayed via the client device. The alarm message comprises at least one of an indication that a liquid is detected in the wafer processing device 300, one or more indications of one or more sections of the wafer processing device 300 in which liquid is detected, or other indication. In some embodiments, an alarm sound is output via a speaker connected to the client device in response to triggering the alarm. In some embodiments, the third signal 418 comprises a message, such as at least one of an email, a text message, etc., transmitted in response to detecting a liquid in the wafer processing device 300. In some embodiments, in response to detecting a liquid in the wafer processing device 300, a telephonic call is made to a client device, such as a landline or a mobile phone, of the one or more client devices 406, such as using a dialer of the controller 206.

In some embodiments, the one or more current signals 420 are used as feedback based upon which operation of one or more devices is controlled by the controller 206. In some embodiments, the controller 206 controls operation of the one or more devices based upon at least one of the liquid status information associated with the wafer processing device 300, the plurality of sets of liquid status information associated with the plurality of sections of the wafer processing device 300, or other information. The one or more devices comprise at least one of the wafer processing device 300, the temperature control unit 404, the liquid cooling system 402, or other device.

In some embodiments, operation of the wafer processing device 300 is controlled using the first signal 414. In some embodiments, the first signal 414 is indicative of one or more instructions.

In some embodiments, the wafer processing device 300 stops operation of the wafer processing device 300 based upon the first signal 414 at least one of indicating that a liquid is detected in the wafer processing device 300 or indicating an instruction to stop the operation of the wafer processing device 300. In some embodiments, the first signal 414 indicates the instruction to stop the operation of the wafer processing device 300 based upon a determination, by the controller 206, that a liquid is detected in the wafer processing device 300. In some embodiments, stopping operation of the wafer processing device 300 comprises at least one of powering off one or more components of the wafer processing device 300, disconnecting a power supply from one or more components of the wafer processing device 300, the wafer processing device 300 entering a mode in which the wafer processing device 300 does not perform one or more operations, or other action.

In some embodiments, the wafer processing device 300 transfers from a first mode to a second mode based upon the first signal 414 at least one of indicating that a liquid is detected in the wafer processing device 300 or indicating an instruction to transfer from the first mode to the second mode. In some embodiments, the first mode is a mode in which the wafer processing device 300 performs one or more first operations and the second mode is a mode in which the wafer processing device 300 performs one or more second operations different than the one or more first operations. In some embodiments, the first mode is a mode in which at least one of a component is unlocked or access to the component is not blocked and the second mode is a mode in which at least one of the component is locked or access to the component is blocked. In some embodiments, the first mode is a mode in which at least one of one or more functions of the wafer processing device 300 are enabled or initiation of a new process using the one or more functions is not blocked and the second mode is a mode in which at least one of the one or more functions of the wafer processing device 300 are disabled or initiation of a new process using the one or more functions is blocked.

In some embodiments, operation of at least one of the temperature control unit 404 or the liquid cooling system 402 is controlled using the second signal 416. In some embodiments, the second signal 416 is indicative of one or more instructions. In some embodiments, liquid detected in the wafer processing device 300 is from the liquid cooling system 402, such as a result of liquid from the liquid cooling system 402 leaking from at least one of a tube, a manifold, etc. of the liquid cooling system 402.

In some embodiments, the temperature control unit 404 stops operation of the liquid cooling system 402 based upon the second signal 416 at least one of indicating that a liquid is detected in the wafer processing device 300 or indicating an instruction to stop the operation of the liquid cooling system 402.

In some embodiments, the temperature control unit 404 disconnects a liquid supply, such as a water supply, from the liquid cooling system 402 based upon the second signal 416 at least one of indicating that a liquid is detected in the wafer processing device 300 or indicating an instruction to disconnect the liquid supply from the liquid cooling system 402.

In some embodiments, the temperature control unit 404 at least one of extracts liquid from one or more tubes of the liquid cooling system 402 or inhibits liquid from entering the one or more tubes of the liquid cooling system 402. In some embodiments, liquid is extracted from the one or more tubes to empty the one or more tubes of liquid. In some embodiments, liquid is extracted from the one or more tubes using a pump. In some embodiments, the temperature control unit 404 at least one of extracts liquid from the one or more tubes of the liquid cooling system 402 or inhibits liquid from entering the one or more tubes of the liquid cooling system 402 based upon the second signal 416 at least one of indicating that liquid is detected in one or more sections of the wafer processing device 300 or indicating an instruction to extract liquid from the one or more tubes. In some embodiments, the one or more tubes are determined based upon the one or more sections, of the wafer processing device 300, in which liquid is detected. In some embodiments, the one or more sections in which liquid is detected is determined based upon the plurality of sets of liquid status information associated with the plurality of sections. In some embodiments, each tube of the one or more tubes is at least one of within a section of the one or more sections in which liquid is detected or is within a threshold distance of the section. In some embodiments, liquid detected in the one or more sections is from a tube of the one or more tubes, such as due to liquid leakage of the tube. In some embodiments, at least one of extracting liquid from the one or more tubes of the liquid cooling system 402 or inhibiting liquid from entering the one or more tubes prevents more liquid from entering the wafer processing device 300, thereby preventing damage to the wafer processing device 300.

Figure 5:
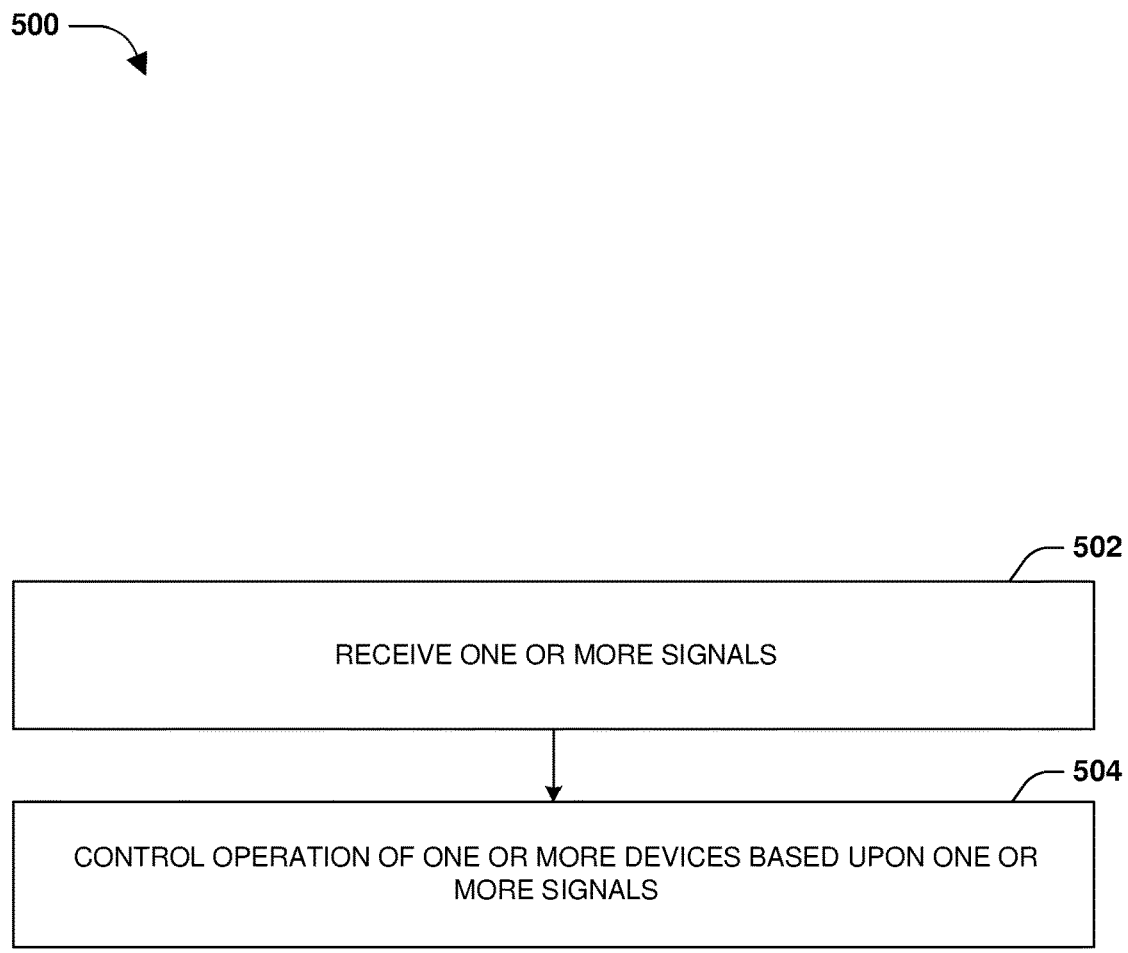
FIG. 5 is a flow diagram illustrating a method of controlling operation of one or more devices, in accordance with some embodiments.

A method 500 of controlling operation of one or more devices is illustrated in FIG. 5 in accordance with some embodiments. At 502, one or more signals, such as the one or more current signals 420, are received. The one or more signals are received by a controller, such as the controller 206. At 504, operation of one or more devices is controlled based upon the one or more signals. In some embodiments, the one or more devices comprise at least one of the wafer processing device 300, the temperature control unit 404, the liquid cooling system 402, or other device. In some embodiments, based upon the one or more signals, the controller determines information comprising at least one of the liquid status information associated with the wafer processing device 300, the plurality of sets of liquid status information associated with the plurality of sections of the wafer processing device 300, or other information. In some embodiments, the operation of the one or more devices is controlled based upon the information.

Figure 6:
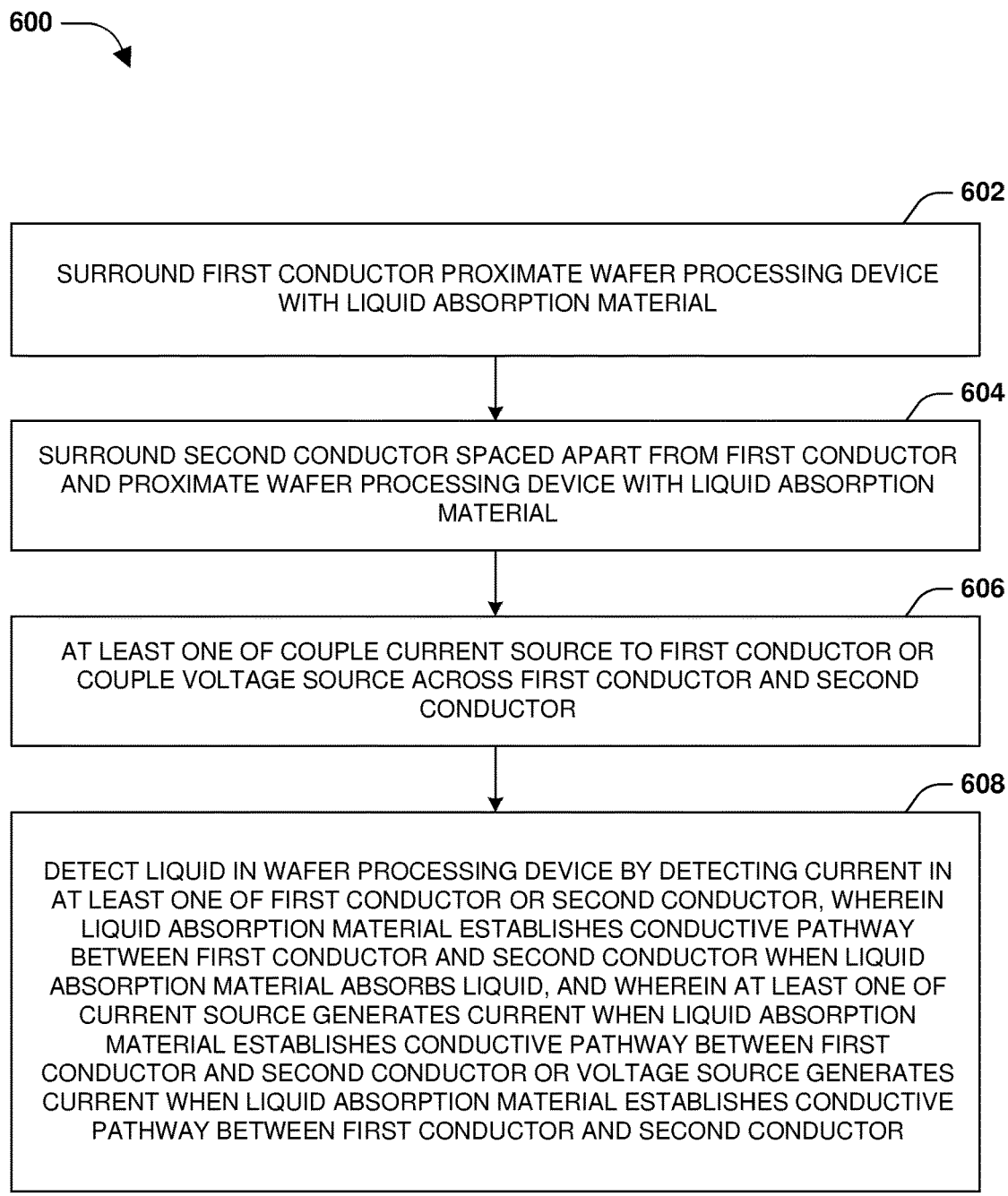
FIG. 6 is a flow diagram illustrating a method of detecting a liquid in a wafer processing device, in accordance with some embodiments.

A method 600 of detecting a liquid in a wafer processing device, such as the wafer processing device 300, is illustrated in FIG. 6 in accordance with some embodiments. At 602, a first conductor proximate the wafer processing device is surrounded with a liquid absorption material. In some embodiments, the first conductor is the first conductor 104 or other conductor. At 604, a second conductor spaced apart from the first conductor and proximate the wafer processing device is surrounded with the liquid absorption material. In some embodiments, the second conductor is the second conductor 108 or other conductor. In some embodiments, acts 602 and 604 are performed together. In some embodiments, acts 602 and 604 are performed separately. At 606, at least one of a current source is coupled to the first conductor or a voltage source is coupled across the first conductor and the second conductor. In some embodiments, the power source 202 comprises at least one of the current source or the voltage source. At 608, the liquid is detected in the wafer processing device by detecting a current in at least one of the first conductor or the second conductor. The liquid absorption material establishes a conductive pathway between the first conductor and the second conductor when the liquid absorption material absorbs the liquid. At least one of the current source generates the current when the liquid absorption material establishes the conductive pathway between the first conductor and the second conductor, or the voltage source generates the current when the liquid absorption material establishes the conductive pathway between the first conductor and the second conductor.

In some embodiments, at least one of the first conductor, the second conductor, or the liquid absorption material are placed proximate the wafer processing device.

In some embodiments, in response to detecting the liquid in the wafer processing device, a liquid cooling system, configured to remove heat from the wafer processing device, is disconnected from a liquid supply. In some embodiments, the liquid cooling system is the liquid cooling system 402.

In some embodiments, a signal indicative of the liquid in the wafer processing device is provided. In some embodiments, the signal comprises at least one of the controller signal 218, the first signal 414, the second signal 416 or the third signal 418.

Figure 7:
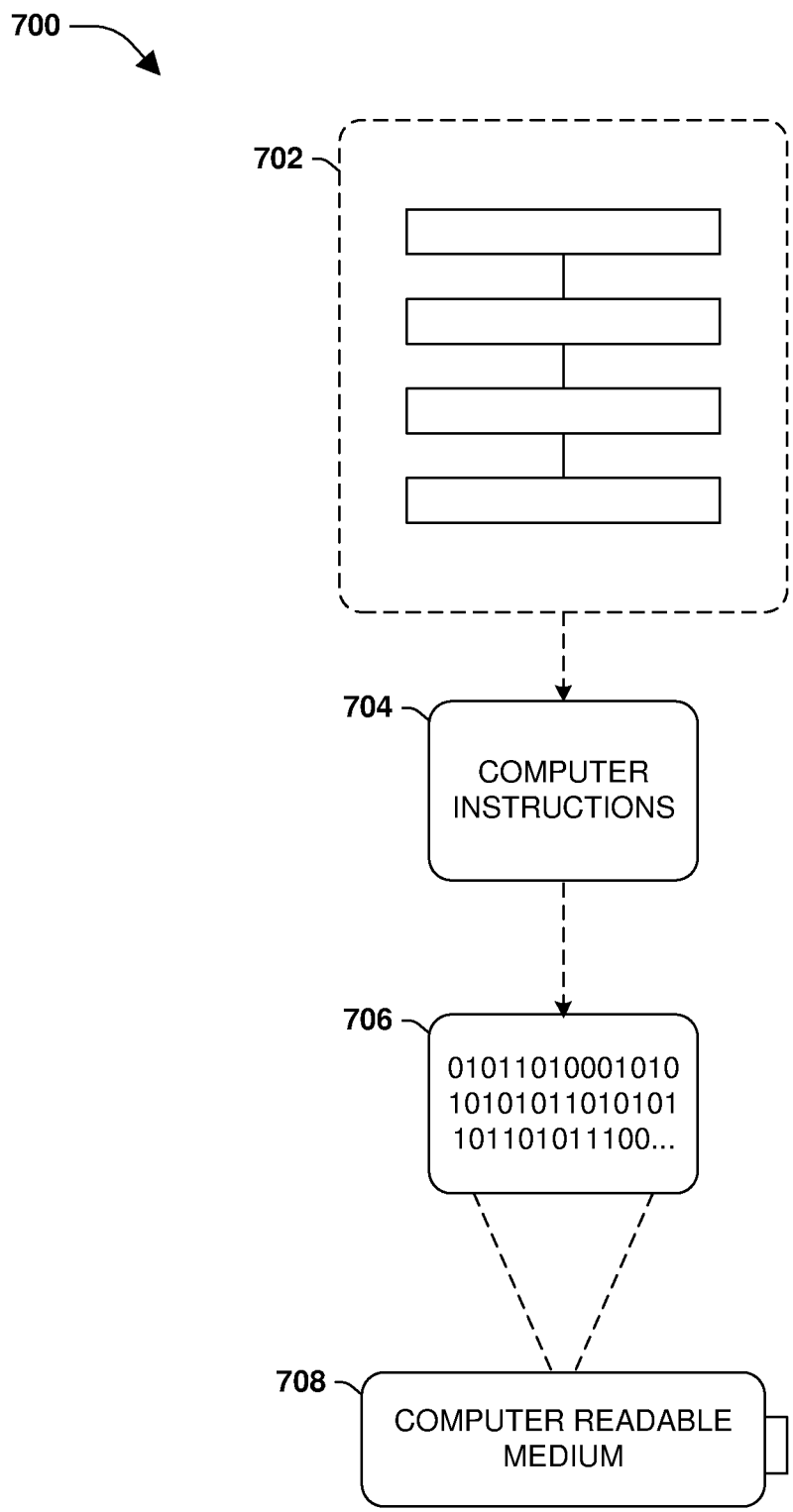
FIG. 7 illustrates an example computer-readable medium wherein processor-executable instructions configured to embody one or more of the provisions set forth herein may be comprised, according to some embodiments.

One or more embodiments involve a computer-readable medium comprising processor-executable instructions configured to implement one or more of the techniques presented herein. An exemplary computer-readable medium is illustrated in FIG. 7, wherein the embodiment 700 comprises a computer-readable medium 708 (e.g., a CD-R, DVD-R, flash drive, a platter of a hard disk drive, etc.), on which is encoded computer-readable data 706. This computer-readable data 706 in turn comprises a set of processor-executable computer instructions 704 configured to implement one or more of the principles set forth herein when executed by a processor. In some embodiments 700, the processor-executable computer instructions 704 are configured to implement a method 702, such as at least some of the aforementioned method(s) when executed by a processor. In some embodiments, the processor-executable computer instructions 704 are configured to implement a system, such as at least some of the one or more aforementioned system(s) when executed by a processor. Many such computer-readable media may be devised by those of ordinary skill in the art that are configured to operate in accordance with the techniques presented herein.

In some embodiments, an apparatus to detect a liquid in a wafer processing device is provided. The apparatus includes a first conductor proximate the wafer processing device. The apparatus includes a second conductor spaced apart from the first conductor and proximate the wafer processing device. The apparatus includes a liquid absorption material surrounding the first conductor and the second conductor. The apparatus includes a current source coupled to the first conductor. The apparatus includes a current detector coupled to at least one of the first conductor or the second conductor. The liquid absorption material establishes a conductive pathway between the first conductor and the second conductor when the liquid absorption material absorbs the liquid in the wafer processing device. A current is generated, by the current source, in at least one of the first conductor or the second conductor through the conductive pathway. The current detector detects the current.

In some embodiments, an apparatus to detect a liquid in a wafer processing device is provided. The apparatus includes a first conductor proximate the wafer processing device. The apparatus includes a second conductor spaced apart from the first conductor and proximate the wafer processing device. The apparatus includes a liquid absorption material surrounding the first conductor and the second conductor. The apparatus includes a voltage source comprising a positive terminal coupled to the first conductor and a negative terminal coupled to the second conductor. The apparatus includes a current detector coupled to at least one of the first conductor or the second conductor. The liquid absorption material establishes a conductive pathway between the first conductor and the second conductor when the liquid absorption material absorbs the liquid in the wafer processing device. A current is generated, by the voltage source, in at least one of the first conductor or the second conductor through the conductive pathway. The current detector detects the current.

In some embodiments, a method for detecting a liquid in a wafer processing device is provided. The method includes surrounding a first conductor proximate the wafer processing device with a liquid absorption material. The method includes surrounding a second conductor spaced apart from the first conductor and proximate the wafer processing device with the liquid absorption material. The method includes at least one of coupling a current source to the first conductor or coupling a voltage source across the first conductor and the second conductor. The method includes detecting the liquid in the wafer processing device by detecting a current in at least one of the first conductor or the second conductor. The liquid absorption material establishes a conductive pathway between the first conductor and the second conductor when the liquid absorption material absorbs the liquid. At least one of the current source generates the current when the liquid absorption material establishes the conductive pathway between the first conductor and the second conductor, or the voltage source generates the current when the liquid absorption material establishes the conductive pathway between the first conductor and the second conductor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers, regions, features, elements, etc. mentioned herein, such as at least one of etching techniques, planarization techniques, implanting techniques, doping techniques, spin-on techniques, sputtering techniques, growth techniques, or deposition techniques such as chemical vapor deposition (CVD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others of ordinary skill in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. An apparatus to detect a liquid in a wafer processing device, comprising:
   a first conductor proximate the wafer processing device;
   a second conductor spaced apart from the first conductor in a first direction and proximate the wafer processing device;
   a liquid absorption material surrounding the first conductor and the second conductor, wherein:
      a void is defined by the liquid absorption material between the first conductor and the second conductor, and
      an axial direction of the void extends in a second direction perpendicular to the first direction;
   a current source coupled to the first conductor; and
   a current detector coupled to at least one of the first conductor or the second conductor, wherein:
      the liquid absorption material establishes a conductive pathway between the first conductor and the second conductor when the liquid absorption material absorbs the liquid in the wafer processing device,
      a current is generated, by the current source, in at least one of the first conductor or the second conductor through the conductive pathway, and
      the current detector detects the current.

2. The apparatus of claim 1, wherein the liquid absorption material comprises cotton.

3. The apparatus of claim 1, wherein:
   the liquid absorption material comprises an inner surface, and
   the inner surface defines an elliptical area.

4. The apparatus of claim 1, wherein:
   the liquid absorption material comprises an inner surface, and
   the inner surface defines a polygonal area.

5. The apparatus of claim 1, wherein:
   the wafer processing device comprises an exposure lens component, and
   the first conductor and the second conductor extend across an outer surface of the exposure lens component.

6. The apparatus of claim 1, wherein:
   the wafer processing device comprises a cool plate, and
   the first conductor and the second conductor extend across an outer surface of the cool plate.

7. The apparatus of claim 1, wherein:
   the wafer processing device comprises a wafer stage, and
   the first conductor and the second conductor extend across an outer surface of the wafer stage.

8. The apparatus of claim 1, comprising:
   a controller coupled to the current detector, wherein the controller provides a signal indicative of the liquid in the wafer processing device.

9. The apparatus of claim 8, wherein the controller provides the signal to a client device.

10. An apparatus to detect a liquid in a wafer processing device, comprising:
    a first conductor proximate the wafer processing device;
    a second conductor spaced apart from the first conductor in a first direction and proximate the wafer processing device;
    a liquid absorption material surrounding the first conductor and the second conductor, wherein:
       a void is defined by the liquid absorption material between the first conductor and the second conductor, and
       an axial direction of the void extends in a second direction perpendicular to the first direction;
    a voltage source comprising:
       a positive terminal coupled to the first conductor; and
       a negative terminal coupled to the second conductor; and
    a current detector coupled to at least one of the first conductor or the second conductor, wherein:
       the liquid absorption material establishes a conductive pathway between the first conductor and the second conductor when the liquid absorption material absorbs the liquid in the wafer processing device,
       a current is generated, by the voltage source, in at least one of the first conductor or the second conductor through the conductive pathway, and
       the current detector detects the current.

11. The apparatus of claim 10, wherein the liquid absorption material comprises cotton.

12. The apparatus of claim 10, wherein:
the liquid absorption material comprises an inner surface, and
the inner surface defines an elliptical area.

13. The apparatus of claim 10, comprising:
a controller coupled to the current detector, wherein the controller provides a signal indicative of the liquid in the wafer processing device.

14. The apparatus of claim 10, wherein:
the wafer processing device comprises an exposure lens component; and
the first conductor and the second conductor extend across an outer surface of the exposure lens component.

15. The apparatus of claim 10, wherein:
the liquid absorption material comprises an inner surface, and
the inner surface defines a polygonal area.

16. The apparatus of claim 10, wherein:
the wafer processing device comprises a wafer stage, and
the first conductor and the second conductor extend across an outer surface of the wafer stage.

17. A method for detecting a liquid in a wafer processing device, comprising:
surrounding a first conductor proximate the wafer processing device with a liquid absorption material;
surrounding a second conductor spaced apart from the first conductor in a first direction and proximate the wafer processing device with the liquid absorption material, such that:
a void is defined by the liquid absorption material between the first conductor and the second conductor, and
an axial direction of the void extends in a second direction perpendicular to the first direction;
at least one of:
coupling a current source to the first conductor, or
coupling a voltage source across the first conductor and the second conductor; and
detecting the liquid in the wafer processing device by detecting a current in at least one of the first conductor or the second conductor, wherein:
the liquid absorption material establishes a conductive pathway between the first conductor and the second conductor when the liquid absorption material absorbs the liquid, and
at least one of:
the current source generates the current when the liquid absorption material establishes the conductive pathway between the first conductor and the second conductor, or
the voltage source generates the current when the liquid absorption material establishes the conductive pathway between the first conductor and the second conductor.

18. The method of claim 17, comprising:
placing at least one of the first conductor or the second conductor proximate the wafer processing device.

19. The method of claim 17, comprising:
in response to detecting the liquid in the wafer processing device, disconnecting a liquid cooling system, configured to remove heat from the wafer processing device, from a liquid supply.

20. The method of claim 17, comprising:
providing a signal indicative of the liquid in the wafer processing device.

* * * * *